(12) United States Patent
Tagawa

(10) Patent No.: US 7,763,549 B2
(45) Date of Patent: Jul. 27, 2010

(54) SEMICONDUCTOR DEVICE MANUFACTURING METHOD FOR PREVENTING PATTERNS FROM INCLINING IN DRYING PROCESS

(75) Inventor: Fumitake Tagawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 17 days.

(21) Appl. No.: 11/393,800

(22) Filed: Mar. 31, 2006

(65) Prior Publication Data

US 2006/0223318 A1   Oct. 5, 2006

(30) Foreign Application Priority Data

Mar. 31, 2005 (JP) .............................. 2005-100852
Jan. 6, 2006 (JP) .............................. 2006-001353

(51) Int. Cl.
  *H01L 21/02*   (2006.01)
(52) U.S. Cl. .................... 438/745; 134/1.3; 510/175
(58) Field of Classification Search ................ 438/623, 438/624, 778, 675, 745, 748; 430/311, 313; 257/E21.171, E21.586; 510/175; 134/1.3
  See application file for complete search history.

(56) References Cited

U.S. PATENT DOCUMENTS

| | | | | |
|---|---|---|---|---|
| 5,326,672 A | * | 7/1994 | Tanaka et al. ............... | 430/322 |
| 5,374,502 A | * | 12/1994 | Tanaka et al. ............... | 430/322 |
| 5,643,764 A | * | 7/1997 | Kosak et al. ............... | 435/91.1 |
| 5,658,711 A | * | 8/1997 | Matsuo et al. ............... | 430/324 |
| 5,678,116 A | * | 10/1997 | Sugimoto et al. ........... | 396/611 |
| 5,873,177 A | * | 2/1999 | Honda et al. ................... | 34/58 |
| 5,977,041 A | * | 11/1999 | Honda ........................ | 510/175 |
| 5,985,400 A | * | 11/1999 | Hennessey ................. | 428/64.1 |
| 6,351,039 B1 | * | 2/2002 | Jin et al. ..................... | 257/759 |
| 6,451,510 B1 | * | 9/2002 | Messick et al. ............. | 430/311 |
| 6,516,815 B1 | * | 2/2003 | Stevens et al. ............. | 134/25.4 |
| 6,770,151 B1 | * | 8/2004 | Ravkin et al. ................. | 134/33 |
| 6,774,058 B2 | * | 8/2004 | Li .............................. | 438/787 |
| 6,928,746 B2 | * | 8/2005 | Arena-Foster et al. ........ | 34/351 |

(Continued)

FOREIGN PATENT DOCUMENTS

JP    08-008163    1/1996

(Continued)

OTHER PUBLICATIONS

Definition of "amphiphilic"; online Academic Press Dictionary of Science and Technology.*

(Continued)

*Primary Examiner*—David Vu
*Assistant Examiner*—Earl N Taylor
(74) *Attorney, Agent, or Firm*—Young & Thompson

(57) ABSTRACT

A method of manufacturing a semiconductor device of the present invention has the steps of forming a pattern made of a processed film or a resist on a substrate, washing the pattern with a washing liquid which is a liquid including at least water, spreading an amphiphilic material that has a hydrophilic group and a hydrophobic group on the surface of the washing liquid remaining on the substrate after washing the pattern, and drying the substrate to remove the washing liquid on the substrate after spreading the amphiphilic material. When moisture is removed in the drying step, molecules of the amphiphilic material are spread on the surface of the washing liquid, so that the surface tension of the washing liquid is reduced to prevent the pattern from inclining.

19 Claims, 12 Drawing Sheets

U.S. PATENT DOCUMENTS

| | | | |
|---|---|---|---|
| 6,960,539 B2 * | 11/2005 | Higuchi et al. | 438/778 |
| 7,008,885 B2 * | 3/2006 | Li et al. | 438/787 |
| 2002/0006585 A1 * | 1/2002 | Koh et al. | 430/314 |
| 2002/0115022 A1 * | 8/2002 | Messick et al. | 430/311 |
| 2003/0113657 A1 * | 6/2003 | Nagahara et al. | 430/270.1 |
| 2004/0029395 A1 * | 2/2004 | Zhang et al. | 438/748 |
| 2004/0029396 A1 * | 2/2004 | Zhang et al. | 438/748 |
| 2004/0053170 A1 * | 3/2004 | Ijima et al. | 430/311 |
| 2004/0053800 A1 * | 3/2004 | Zhang et al. | 510/175 |
| 2004/0090610 A1 * | 5/2004 | Hatakeyama et al. | 355/67 |
| 2004/0131980 A1 * | 7/2004 | Hayasaki et al. | 430/322 |
| 2004/0204328 A1 * | 10/2004 | Zhang et al. | 510/175 |
| 2005/0250054 A1 * | 11/2005 | Chang | 430/329 |
| 2006/0003582 A1 * | 1/2006 | Roh | 438/675 |
| 2006/0141486 A1 * | 6/2006 | Coonan et al. | 435/6 |

FOREIGN PATENT DOCUMENTS

| | | |
|---|---|---|
| JP | 11-265867 | 9/1999 |
| JP | 2003-109897 | 4/2003 |
| JP | 2003-109931 | 4/2003 |
| JP | 2004-078217 | 3/2004 |

OTHER PUBLICATIONS

Definition of "amphophilic"; online Dorland's Illustrated Medical Dictionary.*

Tanaka et al., Mechanism of Resist Pattern Collapse during Development Process, Japan Journal of Applied Physics, vol. 32, Part 1, No. 12B, 1993, pp. 6059-6064.*

Sugawara et al., Surface-Tension Titration of Metal Ions by Using Metal Salts of Fatty Acids as Surface-Active Indicators, Analytische Chemie, 308, 1981, pp. 17-20.*

Lee et al., Resist Pattern Collapse with Top Rounding Resist Profile, Japan Journal of Applied Physics, vol. 42, Part 1, No. 6B, 2003, pp. 3922-3927.*

* cited by examiner

SEMICONDUCTOR DEVICE MANUFACTURING METHOD FOR PREVENTING PATTERNS FROM INCLINING IN DRYING PROCESS

BACKGROUND OF THE INVENTION

1. Field of the Invention

The present invention relates to a method of manufacturing a semiconductor device, which has a pattern formation process using a processed film or a resist.

2. Description of the Related Art

A resist pattern forming method in a lithography process will be described in brief. Assume in the following that a positive resist is used, where exposed portions are dissolved by a developer. Also, a plurality of semiconductor devices and semiconductor substrates during manufacturing are collectively called the "substrate."

After a resist is coated on a processed film formed on a substrate, the resist is exposed. Then, the resist is developed to dissolve exposed portions of the resist in a developer, and the developer is washed away by pure water. Then, the substrate is dried to remove the pure water remaining on the substrate. A developing apparatus for performing the development process to a drying process will be described below.

FIG. 1 is a diagram for describing a developing apparatus. As illustrated in FIG. 1, the developing apparatus comprises stage 10 for holding substrate 200; stage driving unit 11 for rotating stage 10; cup 12 for recovering water coming off from substrate 200; a discharging mechanism for discharging developer onto substrate 200; and control unit 16 for controlling the respective components.

The discharging mechanism comprises hard pipe 17 for supplying a developer onto substrate 200; supporting rod 18 for supporting hard pipe 17; and a supporting rod driving unit 20 for advancing and retracting nozzle 14 of hard pipe 17 over and from substrate 200. Hard pipe 17 is connected to a developer tank (not shown) through flexible tube 19. Stage driving unit 11, discharge amount adjuster 15, and supporting rod driving unit 20 are connected to control unit 16 through communication lines, and operate in accordance with control signals from control unit 16. Control unit 16 has a program previously stored therein for causing the respective components to execute predetermined processes in a determined order.

The developing apparatus is also provided with a discharging mechanism for pure water in addition to the discharging mechanism for the developer. Since the discharging mechanism for pure water is similar in configuration to that for the developer, illustration thereof is omitted.

Next, a method of forming a resist pattern will be described in detail in connection with the operation of the developing apparatus illustrated in FIG. 1. FIGS. 2A to 2D are cross-sectional views illustrating a resist pattern forming method.

Semiconductor substrate 100 is prepared, with processed film 101 formed thereon. Resist 102 is coated on processed film 101 on this substrate by a spin-coat method, and baked (heated), followed by an exposure process which involves irradiating resist 102 with light at a predetermined wavelength through photo-mask 104, as illustrated in FIG. 2A.

Next, as the substrate is carried on stage 10 of the developing apparatus, control unit 16 operates supporting rod driving unit 20 for developer to move nozzle 14 above the substrate. Then, discharge amount adjuster 15 supplies a predetermined amount of developer to nozzle 14 in response to a control signal from control unit 16, causing the developer to be discharged onto the substrate from nozzle 14. As illustrated in FIG. 2B, developer 106 permeates over entire resist 102, as illustrated in FIG. 2B, and developer 106 dissolves exposed portions of resist 102.

After resist 102 has been soaked in the developer for a previously set time, control unit 16 operates supporting rod driving unit 20 for developer to move hard pipe 17 for developer to a position away from cup 12. Then, control unit 16 operates supporting rod driving unit 20 for pure water to move pure water nozzle 14 above the substrate. Then, control unit 16 transmits a supply control signal for supplying pure water to pure water discharge amount adjuster 15. Upon receipt of the supply control signal from control unit 16, pure water discharge amount adjuster 15 supplies a predetermined flow rate of pure water to nozzle 14. The pure water discharged from nozzle 14 washes away developer 106. In this event, control unit 16 may operate stage driving unit 11 to spin the substrate.

Next, as control unit 16 transmits a stop control signal to pure water discharge amount adjuster 15 to stop supplying the pure water, discharge amount adjuster 15, which receives the stop control signal, stops supplying the pure water. Even if the supply of the pure water stops, pure water 110 remains on the substrate, as illustrated in FIG. 2C, where pure water 110 permeates resist patterns 108.

Next, for conducting a spin dry which involves spinning the substrate about the center thereof to centrifugally shake off pure water 110, control unit 16 operates pure water supporting rod driving unit 20 to move pure water hard pipe 17 to a position away from cup 12, and then transmits a rotation control signal to stage driving unit 11 to rotate stage 10. Stage driving unit 11, which has received the rotation control signal, rotates stage 10 at a predetermined rotational speed. After shaking off the pure water on the substrate, as control unit 16 transmits a rotation stop signal to stage driving unit 11 for stopping the rotation of stage 10, stage driving unit 11, upon receipt of the rotation stop signal, stops the operation.

When pure water 110 is shaken off from the substrate by spin drying, as the level of pure water 110 lowers, patterns attract to each other due to surface tension caused by the water which permeates resist patterns 108, causing resist patterns 108 to incline, as illustrated in FIG. 2D. This phenomenon occurs with a higher probability when the aspect ratio (height/width), which is the ratio of the height to the width (length in the lateral direction in the figure) of illustrated resist patterns 108, is equal to or higher than three.

JP-A-2003-109897 discloses a method of solving the problem of resist patterns 108 which inclines due to spin drying. The method disclosed in this document replaces water with a low surface tension rinse liquid (organic solvent or the like). This method weakens the surface tension acting between resist patterns 108 during spin drying, thus preventing resist patterns 108 from inclining even if it has a high aspect ratio.

On the other hand, another method adds a rinse liquid including a surface-active agent to pure water before spin drying to reduce the surface tension of water.

However, the method using a low surface tension rinse liquid consumes a large amount of chemicals, thus causing a higher running costs and environmental problems because the liquid that is emitted as wasted fluid from the developing apparatus causes considerable damage to the environment. Also, this method has the problem that complete replacement is difficult because the method utilizes the difference in specific gravity between water and rinse liquid.

Also, for producing the effect of reducing surface tension by using a rinse liquid including a surface-active agent, the surface-active agent must be prepared so that it has a predetermined concentration or higher. As a larger amount of surface-active agent is included in pure water, a larger amount of surface-active agent also remains on the surface of the dried substrate. This can cause defects of water marks and the like, and the number of defects can amount to several thousands per substrate. Then, a similar problem can arise when pure water is removed from the substrate during the process of washing patterns made of a processed film. If several thousand defects occur per substrate, the yield rate will be significantly reduced.

While other methods can also be contemplated for solving the problem of inclining patterns, disadvantages of such methods will be described below. In a method for reducing the aspect ratio of a resist pattern, the film thickness of the resist is insufficient for etching in the next process, and can therefore fail to function as a mask. On the other hand, in a method for replacing water with a supercritical fluid of carbon dioxide (70 atmospheres) and for drying, not only expensive large-scaled apparatuses are required, but also deaeration, replacement, pressurization, and depression must be performed in order, resulting in long TAT (Turn Around Time). Further, a method for turning a substrate upside down for drying requires complicated and expensive apparatuses but is not effective for patterns that are inclined due to surface tension.

SUMMARY OF THE INVENTION

It is an object of the present invention to provide a method of manufacturing a semiconductor device, which prevents patterns from inclining in a drying process for removing moisture.

According to the present invention, a method of manufacturing a semiconductor device comprises steps of forming a pattern made of a processed film or a resist on a substrate, washing the pattern with a washing liquid which is a liquid including at least water, spreading an amphiphilic material having a hydrophilic group and a hydrophobic group on the surface of the washing liquid remaining on the substrate after washing the pattern, and drying the substrate to remove the washing liquid on the substrate after spreading the amphiphilic material.

In the present invention, molecules of an amphiphilic material are spread on the surface of a washing liquid to reduce the surface tension of the washing liquid. Therefore, even if the level of the washing liquid becomes lowers in the course of drying to cause the surface tension to act on the patterns, the capillary effect due to the surface tension is made smaller than before, thus restraining the patterns from inclining. When the liquid permeating among the patterns is removed in the drying process, the patterns are prevented from inclining, and since the amount of amphiphilic material supplied onto the substrate is only sufficient to spread over the surface of the liquid, the occurrence of defects can be restrained in subsequent processes to improve the yield rate.

The above and other objects, features, and advantages of the present invention will become apparent from the following description with reference to the accompanying drawings which illustrate examples of the present invention.

DETAILED DESCRIPTION OF THE PREFERRED EMBODIMENTS

A method of manufacturing a semiconductor device of the present invention includes spreading a film made of an amphiphilic material on the surface of a washing liquid such as pure water which has permeated the patterns in washing processing, and removing the washing liquid in a drying process.

Embodiment 1

A description will be given of a method of manufacturing a semiconductor device in this embodiment.

Figure 1:
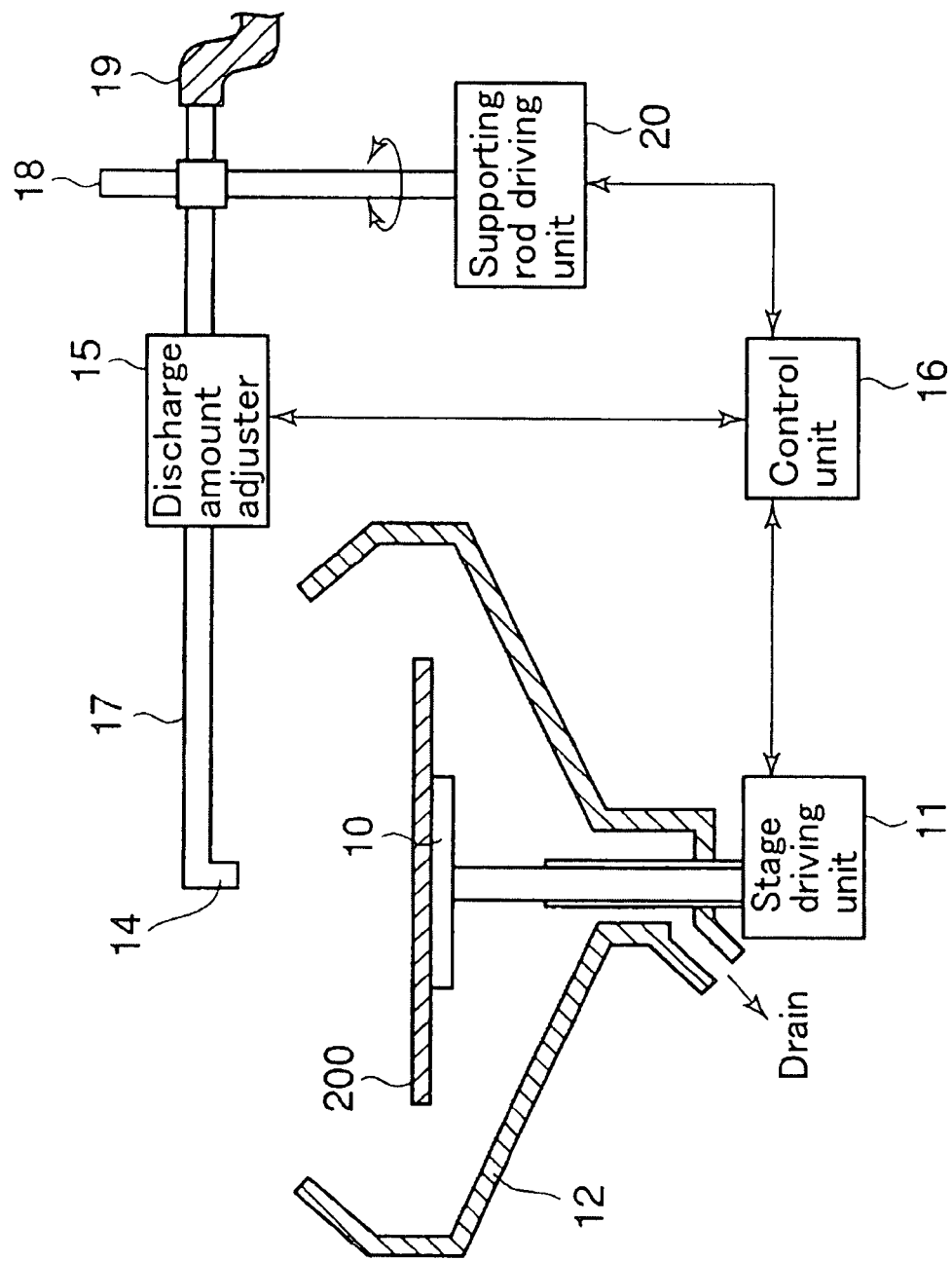
FIG. 1 is a diagram for describing a conventional developing apparatus.

Assume in the method of manufacturing a semiconductor device of this embodiment that the developing apparatus illustrated in FIG. 1 has been previously provided with a discharge mechanism for discharging a solution including an amphiphilic material before the drying process. Since this discharge mechanism for discharging a solution is similar in configuration to the developer discharge mechanism illustrated in FIG. 1, a detailed description thereon is omitted. The developing apparatus used in this embodiment is also provided with a heating mechanism (not shown) for heating a substrate. This heating mechanism may be a resist bake furnace, an RTA (Rapid Thermal Anneal) apparatus, or the like. Assume that this heating mechanism is capable of heating a substrate to a temperature of 600° C. or higher. Since these heating mechanisms are similar in configuration to those used in general, a detailed description thereon is omitted here.

Figure 3:
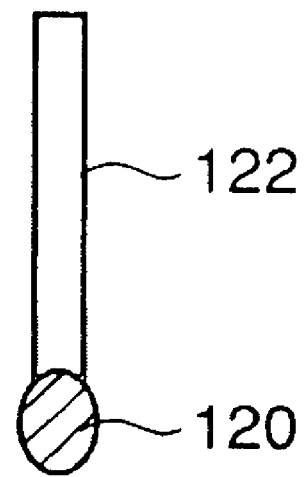
FIG. 3 is a schematic diagram for describing an amphiphilic agent.

Amphiphilic material used in this embodiment will be described in brief. FIG. 3 is a schematic diagram for describing amphiphilic material. As illustrated in FIG. 3, the molecule of the amphiphilic material structurally has chain-like hydrophobic group 122 connected to hydrophilic group 120. In the following, chain-like hydrophobic group 122 is called the "hydrophobic chain." When the amphiphilic material is put in water, the amphiphilic material stands vertically to the surface of the water with hydrophilic group 120 positioned closer to the water surface to form a film composed of the amphiphilic material.

Next, a description will be given of a method of manufacturing a semiconductor device in this embodiment.

FIGS. 4A to 4D are cross-sectional views for describing a method of manufacturing a semiconductor device in this embodiment. For the sake of description, the size of molecules of the amphiphilic material is expressed 100 times or more larger than their actual size with respect to the resist pattern in FIGS. 4A to 4D. The resist pattern in turn has an aspect ratio equal to or larger than three as before.

Figure 2A:
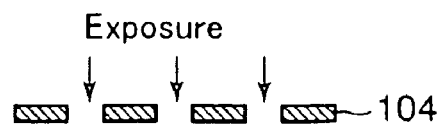
FIGS. 2A to 2D are cross-sectional views for describing a conventional resist pattern forming method.
Figure 2A:
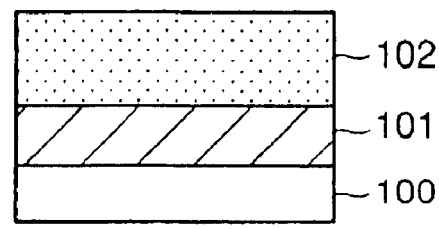
Figure 2B:
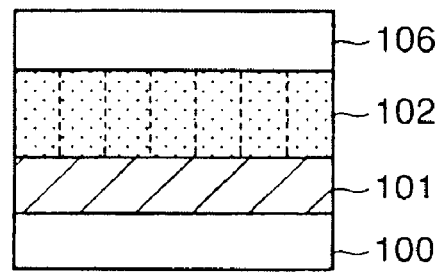
Figure 2C:
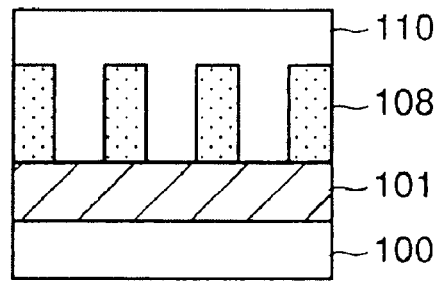
Figure 2D:
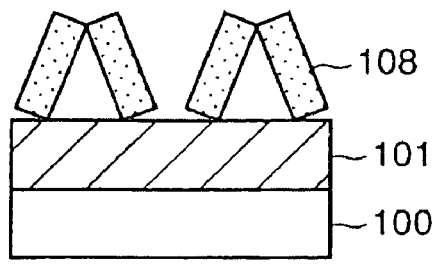
Figure 4A:
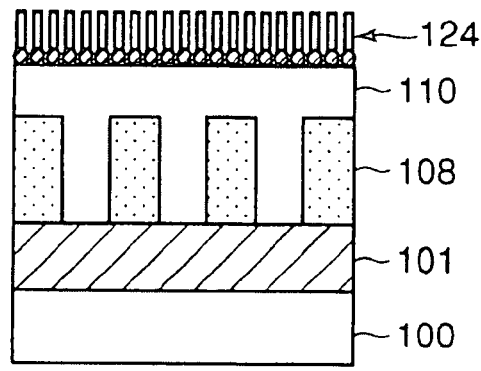
FIGS. 4A to 4D are cross-sectional views for describing a method of manufacturing a semiconductor device in Embodiment 1.

After the developer is replaced with pure water 110 as illustrated in FIG. 2C, a solution containing the amphiphilic material dissolved in an organic solvent is dripped into pure water 110 that remains on the substrate by a predetermined amount (FIG. 4A). In the following, the solvent which contains the amphiphilic material dissolved in an organic solvent is called the "amphiphilic solution." On the other hand, a liquid into which the amphiphilic material is spread, such as pure water 110, is called the "sublayer water."

Stearic acid of long chain fatty acid is used as an example of representative amphiphilic material. The stearic acid is monomolecular, and a film of amphiphilic material formed of monomolecules is called the "monomolecular film." Also, the amphiphilic material in the solution has a concentration of 10E-6 mol/ml. Since the dripped amount is proportional to the surface area of the liquid surface on which the film is spread, the dripped amount is equal to or more than 0.1 cc and less than 5 cc. One of the physical properties exhibited by the monomolecular film is the effect of reducing surface tension. The organic solvent, which is the solvent of the amphiphilic material, volatilizes in a process after the dripping to spin drying.

As the amphiphilic material is dripped into pure water 110, monomolecular film 124 is formed on the surface of pure water 110, as illustrated in FIG. 4A. With monomolecular film 124 spread over the liquid surface of pure water 110, the surface tension of pure water 110 is reduced. As the substrate starts spinning from this state by spin drying, the level of pure water 110 becomes lower. When the level reaches the peak of resist patterns 108 (FIG. 4B), capillary effect due to the surface tension acting between resist patterns becomes smaller than before. As a result, since forces acting on the peaks to attract each other in the resist patterns become weaker than before, resist patterns 108 themselves are prevented from bending and inclining such that the peaks snuggle against each other, and the bottom of resist patterns 108 is prevented from being peeled off processed film 101.

Figure 4B:
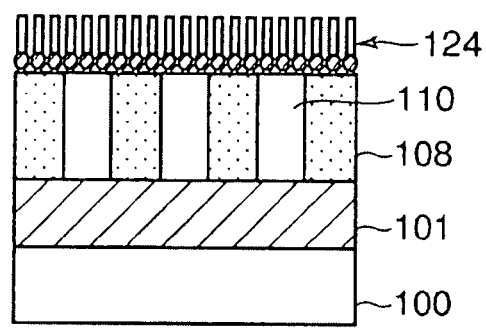
Figure 4C:
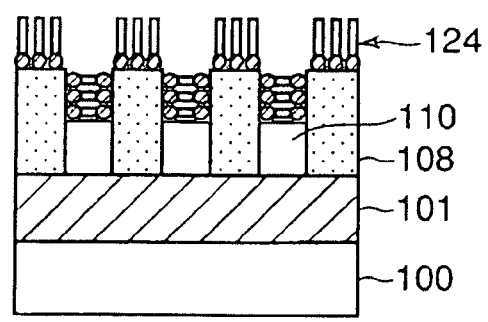
Figure 4D:
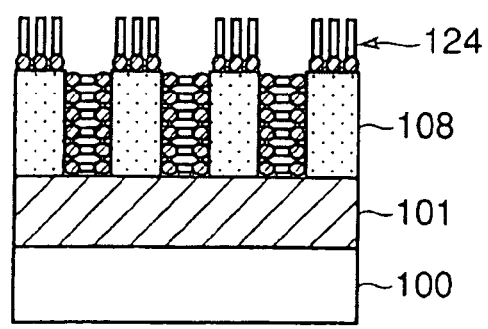

Even if the level further becomes lower to cause monomolecular film 124 to stick to resist patterns 108 along the side wall thereof, as illustrated in FIG. 4C, monomolecular film 124 remains spread over the liquid surface of pure water 110 between the resist patterns. Thus, even in a process in which the level of pure water 110 that remains between the resist patterns becomes lower, the forces acting on resist patterns 108 to attract each other are weaker than before. Then, the substrate is spun for drying until pure water 110 is fully shaken off (FIG. 4D). As illustrated in FIG. 4D, resist patterns 108 do not incline. Afterwards, since resist patterns 108 are used as a mask for etching, monomolecular film 124 is also exposed to the etching and therefore removed.

While spin drying is performed in the drying process described in FIG. 4B, the drying process may include drying by heating, where the drying by heating may be performed instead of spin drying.

In the method of manufacturing a semiconductor device of this embodiment, monomolecular film 124 is spread over the surface of pure water 110 to reduce the surface tension of pure water 110, thus making it possible to reduce the capillary effect due to the surface tension acting among resist patterns 108 to prevent resist patterns 108 from inclining. Also, monomolecular film 124 sticks to the surface of resist patterns 108 to produce the effect of reducing hydrophobicity of resist patterns 108.

While monomolecular film 124 remains on processed film 100 as a residue before the etching process after the formation of resist patterns 108, its concentration is extremely low as compared with the case where a surface active agent is directly added to pure water rinse and the substrate is dried. Therefore, defects due to the residue are so few that they will not cause any problem.

Further, the countermeasures of this embodiment for preventing the patterns from inclining is effective not only for resist patterns but also for patterns that are made of processed films such as insulating film, conductive film and the like.

Next, the aforementioned amphiphilic solution will be described in detail.

Other than stearic acid, amphiphilic materials applicable to this embodiment include myristic acid and the like. Also, while the foregoing embodiment uses monomolecular amphiphilic material as an example, a bimolecular one may be used. Liposome (lipid molecule) or the like has two hydrophobic chains, and forms a bimolecular film from a strong cohesion of hydrocarbons. Since bimolecular film has the physical property of reducing surface tension similar to that of monomolecular film, the following description will also be given in connection with a monomolecular film.

Since the size of one molecule of the amphiphilic material is previously known, it is possible to find an ideal number of molecules from the area of the main surface of a substrate and from the size of the molecule in order to form a monomolecular film which uniformly spreads amphiphilic material over a liquid surface. Then, the concentration and the amount of amphiphilic solution that is dripped are calculated from the thus found ideal number of molecules. While 10E-6 mol/ml is selected as the concentration in this embodiment, a proper range for the concentration is from 10E-5 to 10E-7 mol/ml. The concentration of the amphiphilic material is reduced in this way in order to facilitate control of the amount that is dripped from the relationship between the concentration and the amount that is dripped so as to supply the ideal number of molecules. Because the concentration of amphiphilic material is higher, even a slight increase in the amount that is dripped would result in extension of excessive amphiphilic material, leading to the need for strictly controlling the amount that is dripped. The amphiphilic solution is used in order to facilitate control of amount of amphiphilic material that is supplied as well. Since a volatile organic solvent is used for dissolving the amphiphilic material, an increased amount of solvent will not cause any problem. If the amount of amphiphilic material can be precisely controlled, the amphiphilic material may be directly supplied without using the solvent.

Also, the solvent is not limited to an organic solvent but may be an inorganic solvent as long as it has the ability to dissolve or diffuse the amphiphilic material it, evaporates after extension to the sublayer water or dissolves in the sublayer water and is removed by shaking off the sublayer water from the substrate, and does not impede formation of the amphiphilic material film.

The uniformity with which the amphiphilic material is spread over the liquid surface also depends on the temperature of the sublayer water and the atmospheric pressure. Further, the uniformity depends on the type of amphiphilic material even under the same conditions in regard to the temperature of the sublayer water and the atmospheric pressure. Therefore, not only is the amount of amphiphilic material controlled in accordance with the conditions including the temperature of sublayer water and the atmospheric pressure, but an appropriate amphiphilic material may be selected from a plurality of types. The dependence of the physical properties of the amphiphilic material on the type of amphiphilic material and the temperature of sublayer water will be described later.

Figure 5:
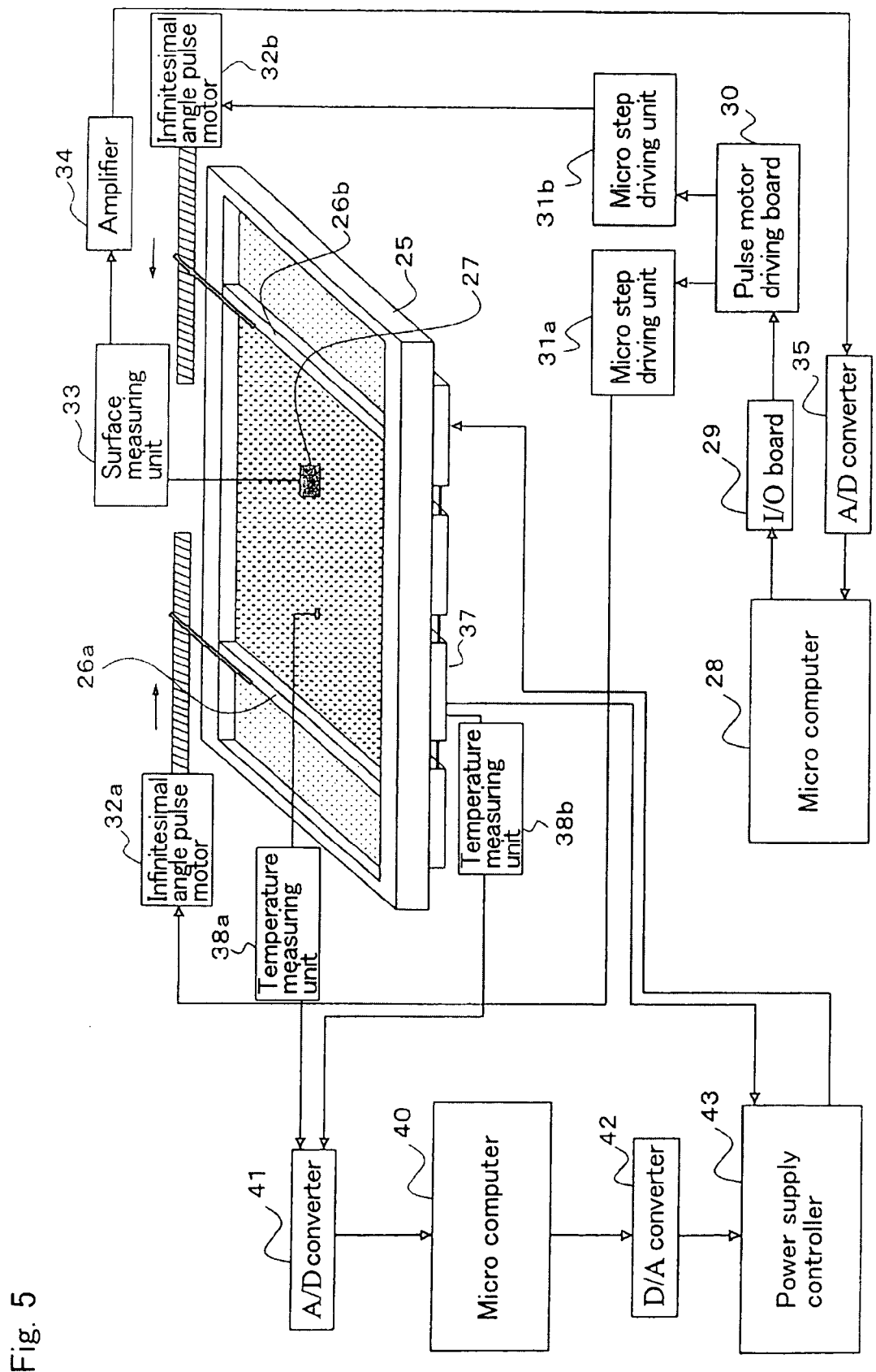
FIG. 5 is a diagram illustrating an exemplary configuration of a surface pressure measuring apparatus.

Next, a description will be given of a method which was used to measure the physical properties of the monomolecular film. FIG. 5 is a diagram illustrating an exemplary configuration of an apparatus for measuring the surface pressure of monomolecular film.

As illustrated in FIG. 5, the surface pressure measuring apparatus comprises bath 25 for spreading a monomolecular film over sublayer water; two movable plates 26a, 26b for changing the area of a range in which the monomolecular film is spread; surface measuring unit 33 for measuring a moving distance of glass plate 27 floating on the sublayer water in the vertical direction; and microcomputer 28 for calculating the surface pressure using the measured value of the moving distance received from surface measuring unit 33.

Between microcomputer 28 and surface measuring unit 33, an amplifier for amplifying a signal indicative of the measured value, and A/D converter 35 for converting data from an analog signal to a digital signal are connected through signal lines. Surface measuring unit 33 is of a Wilhermy type in this embodiment. The operator supplies a monomolecular film in a range surrounded by the frame of bath 25 and movable plates 26a, 26b. In the following, this range is called the "extension range."

Microcomputer 28 stores a program for calculating the surface pressure per unit molecular area using the area of the extension range, the number of monomolecules, and a measured value received from surface measuring unit 33. Microcomputer 28 also stores a program for calculating the surface pressure each time movable plates 26a, 26b are moved by a predetermined distance.

The surface pressure measuring apparatus also comprises I/O board 29 for receiving an operation signal from microcomputer 28 for moving movable plates 26a, 26b to the inside of bath 25 by a predetermined distance; pulse motor driving board 30 for sending a driving signal corresponding to an operation signal received from I/O board 29; and micro step driving units 31a, 31b for transmitting rotating angle signals to infinitesimal angle pulse motors 32a, 32b, respectively, in response to the driving signal received from pulse motor driving board 30. Infinitesimal angle pulse motors 32a, 32b rotate shafts corresponding to the rotating angle signals, causing movable plates 26a, 26b to move by predetermined distances, respectively.

The operation of the surface pressure measuring apparatus will be described in brief.

The operator manipulates microcomputer 28 to enter the number of monomolecules supplied to the extension range and to enter a measurement start instruction. In response to the instruction entered by the operator, microcomputer 28, upon receipt of a measured value from surface measuring unit 33 through amplifier 34 and A/D converter 35, registers this value as an initial value for registering an initial surface pressure. Also, microcomputer 28 calculates an initial area of the extension range from current positions of movable plates 26a, 26b for registration as an initial area.

Next, as microcomputer 28 transmits an operation signal to pulse motor driving board 30 through I/O board 29 in accordance with a program, a driving signal corresponding to the operation signal is applied to micro-step driving units 31a, 31b from pulse motor driving board 30. Then, rotating angle signals are applied to respective infinitesimal angle pulse motors 32a, 32b from respective micro-step driving units 31a, 31b. As infinitesimal angle pulse motors 32a, 32b rotate the shafts in accordance with the rotation angle signals, movable plates 26a, 26b move toward the center of bath 25 by respective predetermined distances. Then, upon receipt of a measured value from surface measuring unit 33 through amplifier 34 and A/D converter 35, microcomputer 28 calculates and stores the surface pressure per unit molecular area from the area of the extension range after movement of movable plates 26a, 26b, and from the measured value, and the number of monomolecules. Next, each time movable plates 26a, 26b are moved by a predetermined distance, microcomputer 28 calculates and stores the surface pressure per unit area of the molecules.

Also, in this embodiment, an incubator is provided for holding the sublayer water in bath 25 at a predetermined temperature in order to examine the dependence of the surface pressure per unit molecular area on temperature. The incubator comprises Peltier element module 37 for supplying heat to the sublayer water from below bath 25; temperature measuring units 38a, 38b for detecting the temperature of the sublayer water and the temperature of Peltier element module 37, respectively; and microcomputer 40 for operating Peltier element module 37 corresponding to measured temperature values received from temperature measuring units 38a, 38b.

A/D converter 41 is also connected to microcomputer 40 for converting measured temperature values received from temperature measuring units 38a, 38b from analog signals to digital signals. Further provided are D/A converter 42 for converting an operation signal from microcomputer 40 for operating Peltier element module 37 from a digital signal to an analog signal, and power supply controller 43 for supplying power to Peltier element module 37 corresponding to the operation signal received from D/A converter 42.

As the operator enters a set temperature for the sublayer water, microcomputer 40 reads a measured temperature value of the sublayer water from temperature measuring unit 38, calculates the difference between the measured value and the set temperature, and transmits an operation signal to power supply controller 43 to bring the sublayer water to the set temperature. As the sublayer water reaches the set temperature, microcomputer 30 continues to monitor measured temperature values from temperature measuring units 38a, 38b, and transmits an operation signal to power supply controller 43 such that the sublayer water is maintained at the set temperature.

Next, a description will be given of a method of measuring the surface pressure.

Figure 6:
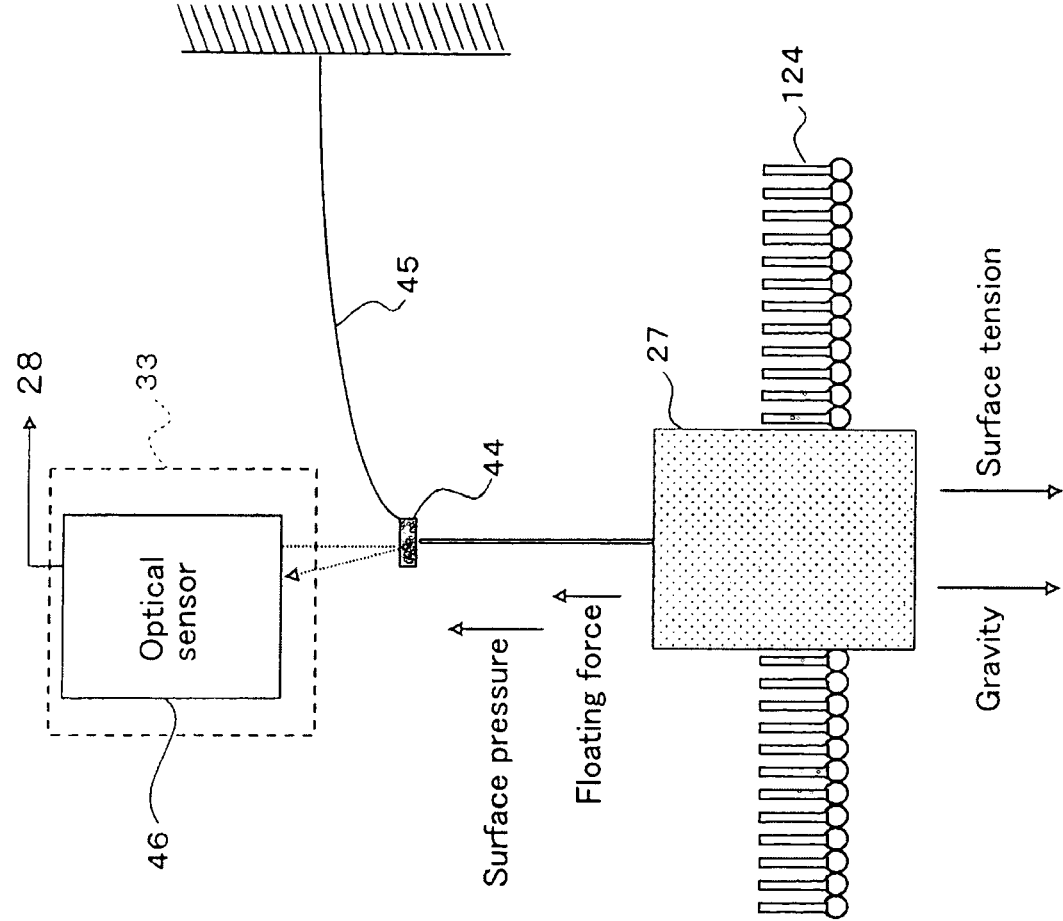
FIG. 6 is a schematic diagram for describing a method of measuring surface pressure.

FIG. 6 is a schematic diagram for describing the method of measuring the surface pressure.

Glass plate 27 is provided with overlying mirror 44 through a vertical rod. Mirror 44 is connected to the wall of bath 25 by plate spring 45. Plate spring 45 is intended to prevent glass plate 27 from moving in the horizontal direction, so that glass plate 27 can move up and down.

Surface measuring unit 33 is provided with optical sensor 46 and a laser light source, not shown. Optical sensor 46 detects a laser beam irradiated from the laser light source and reflected by mirror 44 of glass plate 27 to find a phase difference which is converted to a distance value which is then sent to the outside.

Taking into considering forces acting on glass plate 27, the sum of a floating force and the surface pressure acting upward in a vertical direction balances with the sum of the gravity and the surface tension of the sublayer water acting downward in a vertical direction. Then, the floating force of glass plate 27, the gravity, and the surface tension by the sublayer water can be found previously from the properties of glass plate 27 and sublayer water. Accordingly, the distance by which glass plate 27 moves up and down depends on the surface pressure, so that the surface pressure can be calculated from the relational expression of the four forces and the moving distance of glass plate 27.

As the area of the extension range is reduced to cause glass plate 27 to move upward, optical sensor 46 calculates a moving distance from the detected phase difference of the laser beam, and the measured value is supplied to microcomputer 28. Microcomputer 28 calculates the surface pressure from the floating force of glass plate 27, the gravity, the surface tension by the sublayer water, and the measured value of the moving distance of glass plate 27.

Next, a description will be given of the result of measuring the surface pressure of a molecular film using the surface pressure measuring apparatus described above.

Figure 7:
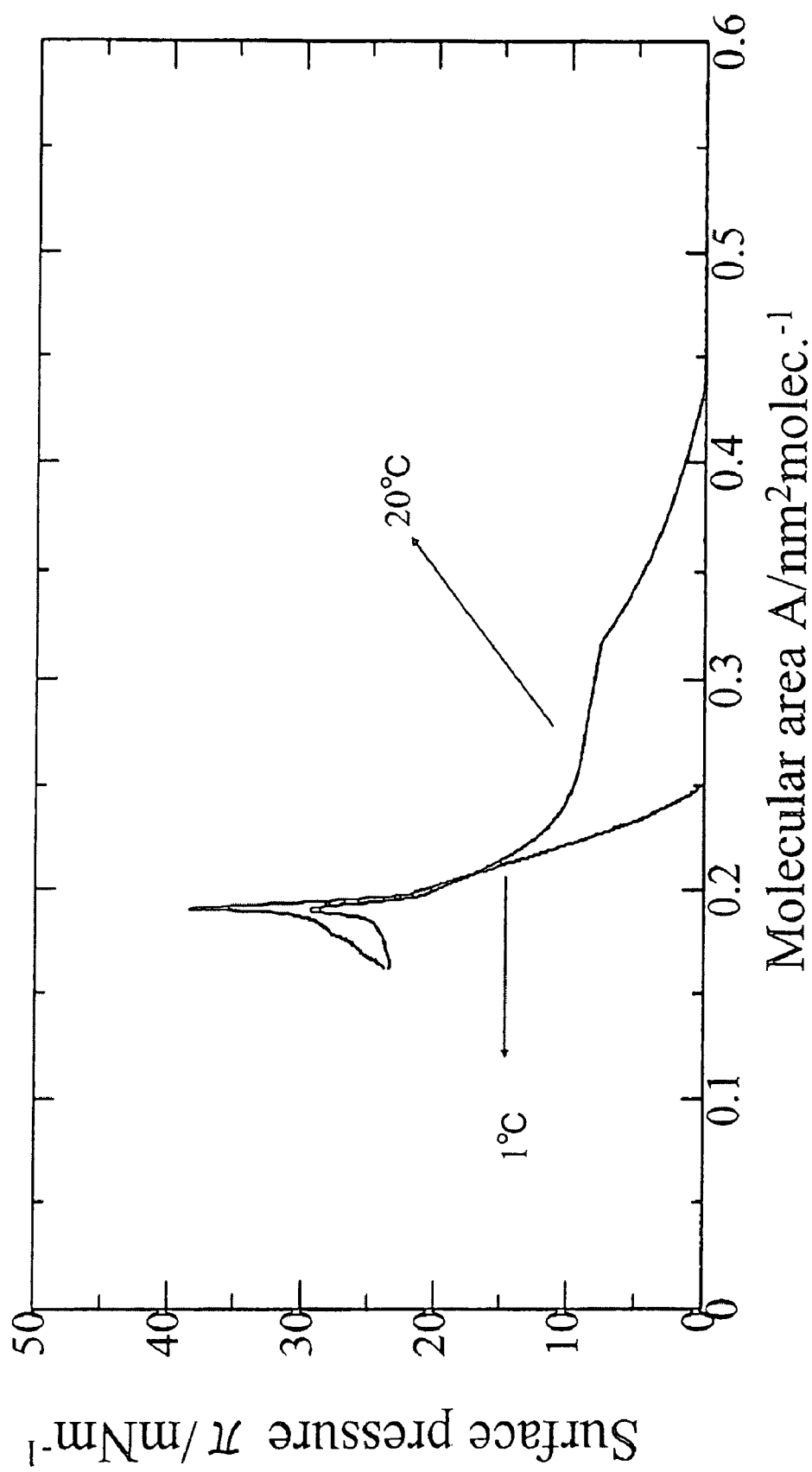
FIG. 7 is a graph showing the dependence of the surface pressure of myristic acid on temperature.

FIG. 7 is a graph showing the dependence of the surface pressure of myristic acid on temperature. The horizontal axis represents the unit area in units of $[nm^2 molec.^{-1}]$. The vertical axis represents the surface pressure in units of $[mNm^{-1}]$. In the following, the indication of units is omitted.

As shown in FIG. 7, when the sublayer water is at a temperature of 20° C., the surface pressure begins to rise from the time at which the unit molecular area is near 0.44, and reaches a maximum value when the unit molecular area is near 0.19. On the other hand, when the sublayer water is at a temperature of 1° C., the surface pressure reaches a maximum value when the unit molecular area is near 0.19, as is the case with the sublayer water at a temperature of 20° C., but the surface pressure begins to rise from the time at which the unit molecular area is 0.25. It is understood from the result shown in FIG. 7 that while a reduction in the unit molecular area causes a change in the surface pressure, the surface pressure varies depending on the temperature condition of the sublayer water, resulting in a different molecular density of the monomolecular film, even with the same amount of the same material.

Figure 8:
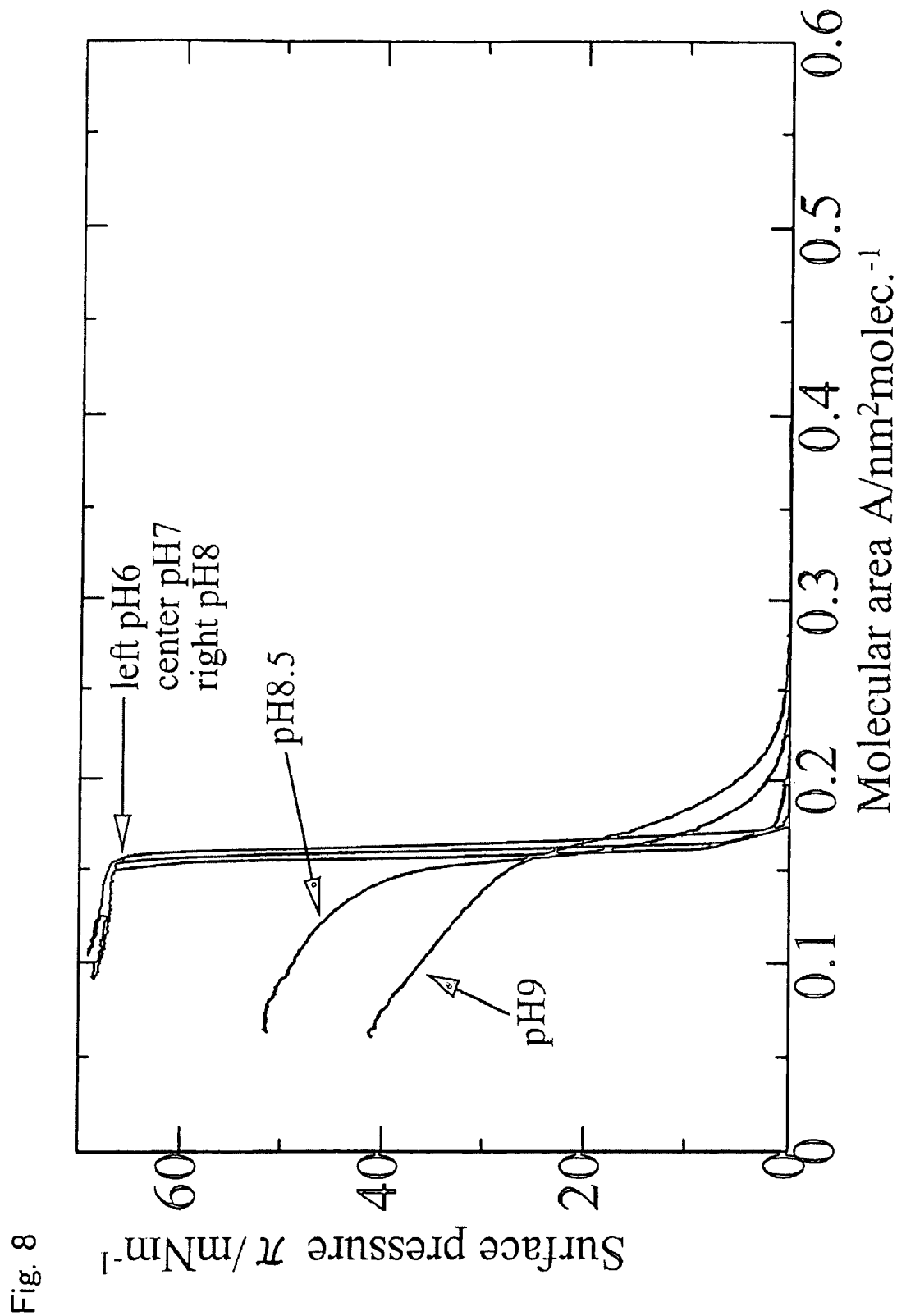
FIG. 8 is a graph showing the dependence of the surface pressure of nickel stearate on pH.

FIG. 8 is a graph showing the dependence of nickel stearate for the surface pressure on pH of the sublayer water. The horizontal axis and vertical axis are similar to those in FIG. 7. Nickel stearate has nickel substituted for hydrogen of stearic acid.

As shown in FIG. 8, when the sublayer water exhibits pH of 6 to 8, variations in the surface pressure substantially follow variations in the unit molecular area, and the surface pressure suddenly rises to 60 or higher when the unit molecular area is near 0.17. On the other hand, when pH=8.5 and pH=9, the surface pressure begins rising from the time at which unit molecular area is near 0.25, but even when the unit molecular area is 0.17, the surface pressure does not grow so much as when pH is 6 to 8, and the surface pressure is equal to or lower than 50 when the unit molecular area is 0.1. When a metal is introduced into the amphiphilic material as salt, the surface pressure of the monomolecular film is affected by pH of the sublayer water, so that it is understood that the molecular density of the monomolecular film depends on pH of the sublayer water.

It is understood from the results shown in FIGS. 7 and 8 that the temperature and pH of the sublayer water serve as factors for controlling the surface pressure. Therefore, for forming a monomolecular film more uniform in density on the surface of the sublayer water, the amount of amphiphilic material supplied to the sublayer water may be controlled in correspondence to the temperature and pH of the sublayer water. In the resist pattern forming method shown in FIGS. 4A to 4D, it can be thought that the pH value of pure water remaining on the substrate, even after pure water rinsing, does not present a stable pH value due to a developer or the like. In this event, a pH conditioning chemical (chelating agent or the like) may be dripped before the amphiphilic material is spread so as to avoid an impediment to the formation of a film from the amphiphilic material, such as aggregation.

Next, a description will be given of the substrate drying process. In the method of manufacturing a semiconductor device described in connection with FIGS. 4A to 4D, ordinary spin drying was performed in the drying process. Other than ordinary spin drying, four methods can be contemplated for the substrate drying method. These methods will be described below.

(1) The rotational speed of the spin drying is initially lower than general speed, and later increased to a high rotational speed similar to general speed. The rotational speed is initially set low to slowly raise the level of the sublayer water in order to prevent the monomolecular film from coming off together with the sublayer water.

(2) The substrate is inclined before the spin drying to reduce the amount of the sublayer water remaining on the substrate before the amphiphilic solution is dripped. By reducing the amount of the sublayer water remaining on the substrate to reduce the time required for the subsequent spin drying, the monomolecular film and patterns are less affected by the centrifugal force. This prevents the monomolecular film from coming off and patterns from inclining.

(3) The amphiphilic solution is supplemented during spin drying. Even if part of the monomolecular film comes off due to a centrifugal force, the uniformity of the monomolecular film can be maintained by supplementing the amphiphilic solution.

(4) When the level of the sublayer water on the substrate becomes lower to reduce the surface tension acting on the patterns, a heat drying is performed to evaporate the remaining sublayer water and monomolecular film. In this event, both the sublayer water and monomolecular film can be evaporated when they are heated at the higher temperature of the boiling points of the sublayer water and monomolecular film.

On the other hand, taking into consideration of the heat resistant temperature of the patterns, an upper limit value for the heating temperature can be thought, as follows, when the patterns are made of a resist. The amphiphilic material evaporates at temperature of 250° C. or higher. The temperature of 250° C. or higher exceeds the upper heat resistant temperature of general resist patterns, though this depends on the type of resist patterns. For this reason, when the drying method (4) is applied to resist patterns, it is not desirable to heat resist patterns at a temperature of 250° C. or higher. From this conclusion, in actual operations, the upper limit value for the heating temperature may be up to 240° C., at which point the patterns are not affected by deformation by a resist process, or taking into consideration a margin of heat resistant temperature. This is because the resist suffers from a change in pattern shape due to heat stagnation before the resist is affected by heat in chemical composition.

On the other hand, when the patterns are made of a processed film, the upper limit for the heating temperature is considered in the following manner. According to the properties of the amphiphilic material, when the heating temperature is set to 250° C. or higher, it evaporates. When the amphiphilic material is evaporates, no amphiphilic material remains on the substrate, so that the amphiphilic material will not affect or cause defects in subsequent processes. When the heating temperature is set to 360° C. or higher, the amphiphilic material thermally decomposes. To prevent the amphiphilic material from thermally decomposing, the upper limit for the heating temperature is preferably set to 350° C., taking into consideration of a margin of temperature. However, since the amphiphilic material volatizes even when it thermally decomposes or oxidizes, it will not cause defects. Therefore, the upper limit may be set to 360° C. or higher, however, the temperature is preferably not set to exceed 600° C. in order to restrain the diffusion of conductive impurities in the impurity diffusion layer of transistors.

When the patterns are made either of a resist or of a processed film, a lower limit for the heating temperature is preferably set to 100° C. at which point water evaporates. Also, the foregoing range of the heating temperature is applied when heat drying is performed in the drying process described in connection with FIG. 4B.

For a substrate drying process, an ordinary spin dry may be applied in combination with at least one of the aforementioned drying methods (1)-(4). Also, at least some of the drying methods (1)-(4) may be combined. Further, heat drying may be included in the drying methods (1)-(3).

Embodiment 2

In this embodiment, the present invention is applied to a process of washing patterns formed in processed film. In this embodiment, capacitors of DRAM (Dynamic Random Access Memory) are used as patterns. A DRAM memory element will be described in brief with respect to the configuration.

Figure 9:
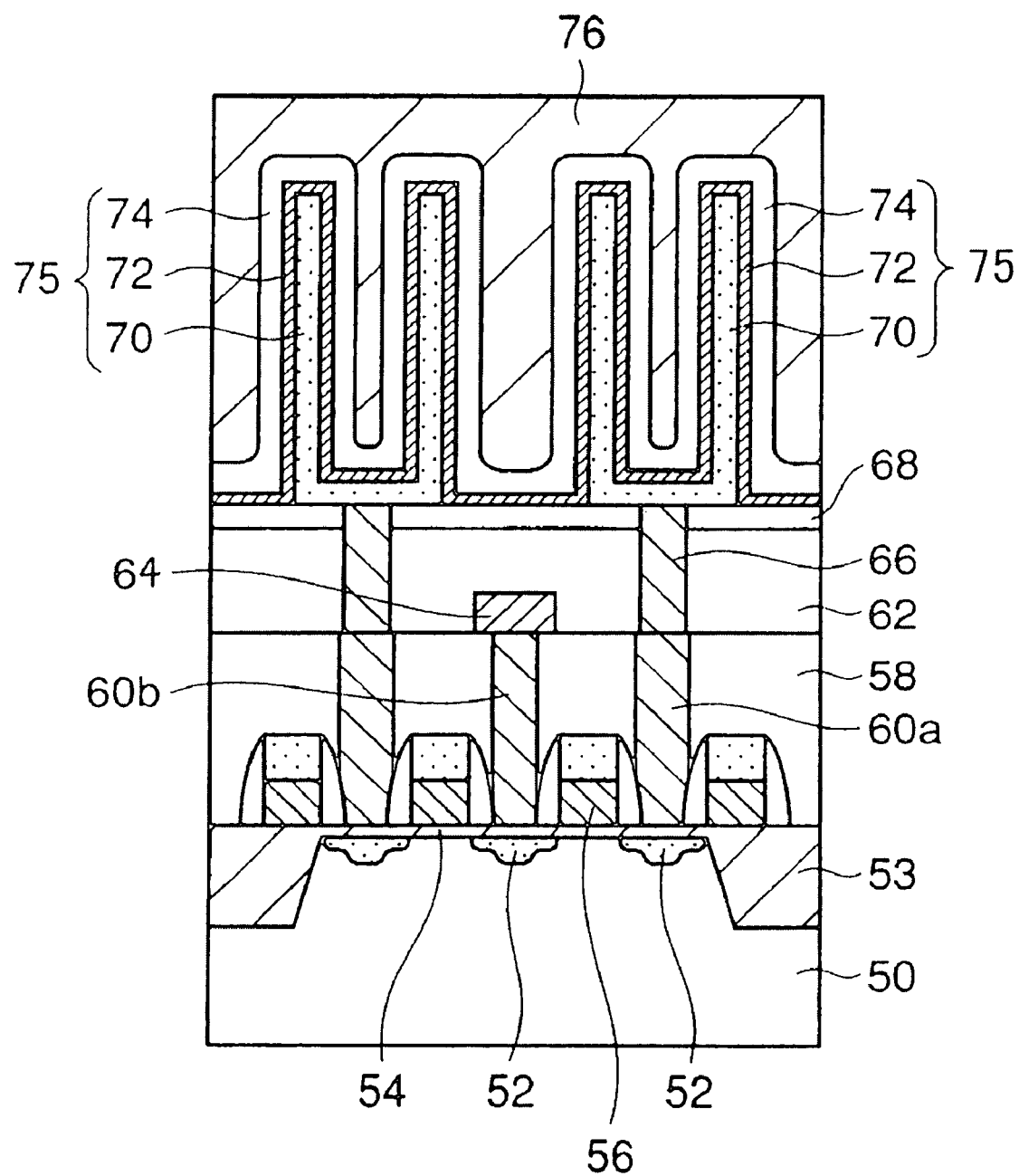
FIG. 9 is a cross-sectional view illustrating an exemplary configuration of a memory element for DRAM.

FIG. 9 is a cross-sectional view illustrating an exemplary configuration of a DRAM memory element.

As illustrated in FIG. 9, the memory element comprises a capacitor for storing information, and a transistor for writing and reading information into and from the capacitor. The transistor has a source electrode and a drain electrode of impurity diffusion layers 52 formed near the main surface of semiconductor substrate 50, and gate electrode 56 formed on gate insulating film 54. The transistor is electrically insulated from other transistors by element separation region 53.

The capacitor has lower electrode 70 connected to the transistor, upper electrode 74, and capacitive insulating film 72 sandwiched between lower electrode 70 and upper electrode 74. Since lower electrode 70 has a height three times or more larger than the diameter of the bottom, the lower electrode of the capacitor has an aspect ratio (height/diameter of bottom) equal to or larger than three. Upper electrode 74 is covered with insulating film 76. In this embodiment, lower electrode 70 of the capacitor has a circular bottom.

One of two impurity diffusion layers 52 of the transistor is connected to lower electrode 70 through first plug 60a formed in first inter-layer insulating film 58 and second plug 66 formed in second inter-layer insulating film 62. The other impurity diffusion layer 52 is connected to bit line 64 through first plug 60b.

Next, a description will be given of a method of manufacturing a semiconductor device which includes capacitors in its configuration. A washing apparatus is previously prepared, which has the ability to perform such processing such as pure water rinsing of the developing apparatus, dripping of the amphiphilic solution, and spin drying, as described in Embodiment 1. Amphiphilic material is chosen as myristic acid.

FIGS. 10A to 10I are cross-sectional views for describing the method of manufacturing a semiconductor device of this embodiment. The configuration from bit line 64 toward semiconductor substrate 50 is omitted in the illustrations of FIGS. 10A to 10I. In these figures, the size of molecules of the amphiphilic material is expressed 100 times or more larger with respect to the pattern of capacitors, as is the case with Embodiment 1.

Figure 10A:
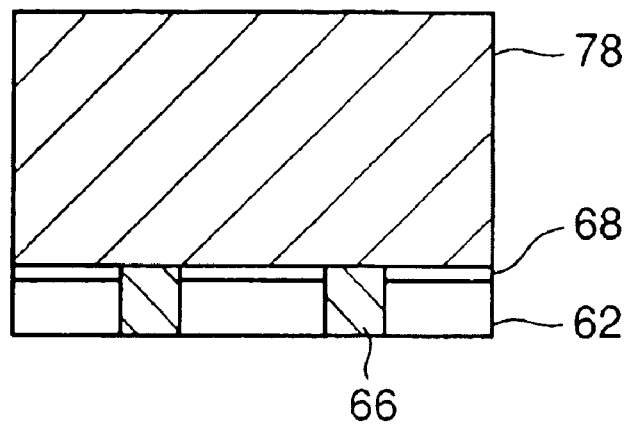
FIGS. 10A to 10I are cross-sectional views for describing a method of manufacturing a semiconductor device in Embodiment 2.

After second inter-layer insulating film 62 and etching stopper insulating film 68, shown in FIG. 9, have been formed, second plug 66 is formed. Then, BPSG (Boro-Phospho Silicate Glass) film 78 is formed on etching stopper insulating film 68, as illustrated in FIG. 10A. In this event, BPSG film 78 is formed such that its thickness is equivalent to the height of lower electrode 70.

Figure 10B:
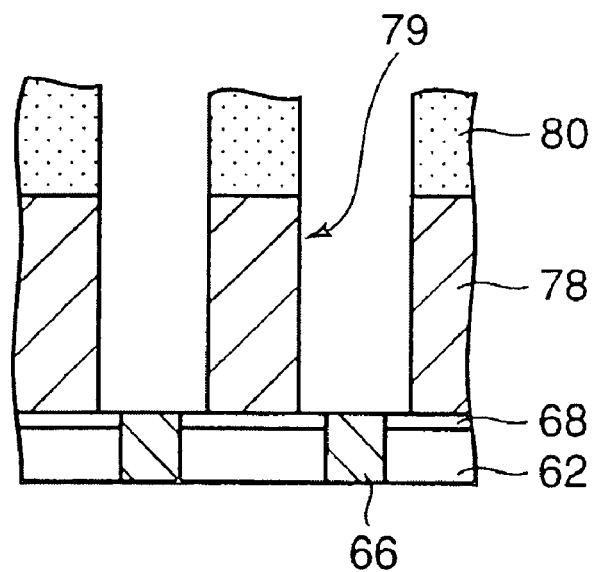
Figure 10C:
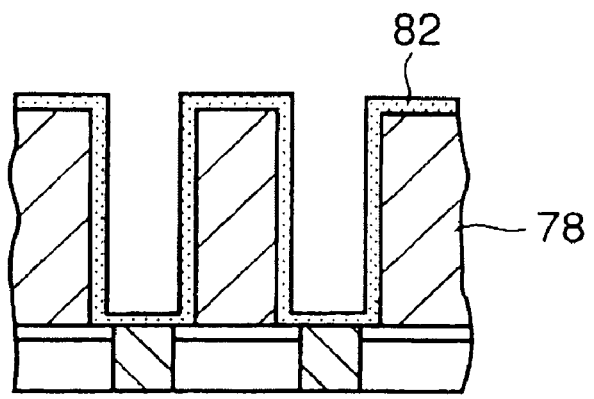

Next, resist pattern 80 is formed in a lithographic process for forming openings for lower electrodes, and BPSG film 78 is anisotropically etched using resist pattern 80 as a mask to form openings 79 (FIG. 10B). Opening 79 has a height three times or more larger than the diameter of its bottom. Even if BPSG film 78 is equivalent to second inter-layer insulating film 62 in etching selection ratio, second inter-layer insulating film 62 is prevented from being etched by etching stopper insulating film 68 when this anisotropic etching is performed. Next, after resist pattern 80 is removed, polysilicon film 82, in which conductive impurities have been diffused (hereinafter called "impurity doped polysilicon film") is formed on the side wall and bottom of openings 79 and on BPSG film 78 by a CVD (Chemical Vapor Deposition) method.

Figure 10D:
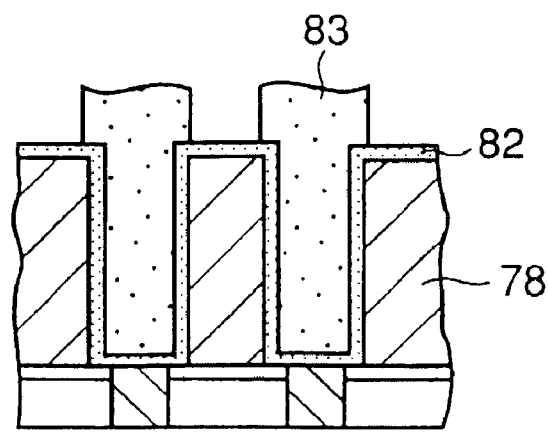
Figure 10E:
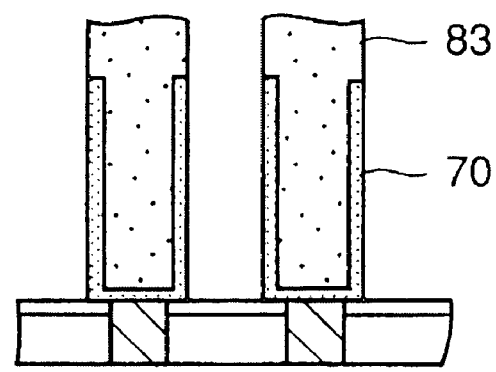

As illustrated in FIG. 10D, resist pattern 83 is formed by a lithographic process for forming a lower electrode pattern. Then, impurity doped polysilicon film 82 is anisotropically etched using resist pattern 83 as a mask. Further, BPSG film 78 is wet etched. As illustrated in FIG. 10E, lower electrode 70 is formed. Then, resist pattern 83 is removed with a resist remover.

Figure 10F:
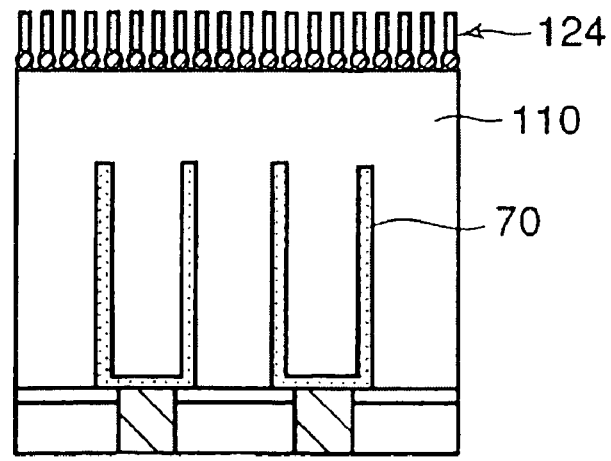

After resist pattern 83 has been removed with the resist remover, the aforementioned washing apparatus is used to inject pure water onto the substrate surface to wash away the resist remover. After the resist remover has been washed away, the injection of pure water is stopped. Then, as the amphiphilic solution, described in Embodiment 1, is dripped into pure water remaining on the substrate, monomolecular film 124 is formed on the surface of pure water 110, as illustrated in FIG. 10F.

Figure 10G:
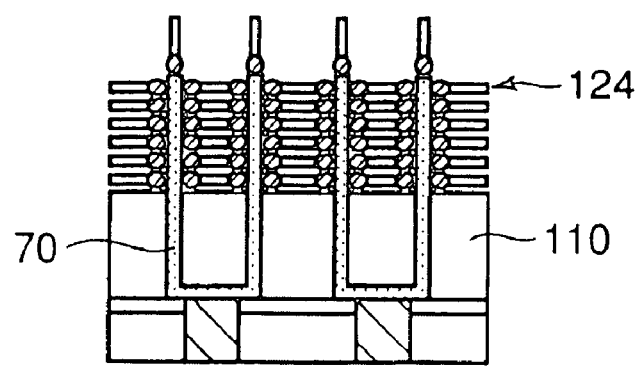
Figure 10H:
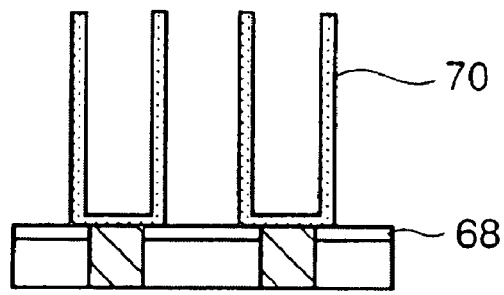

Next, spin drying is performed by a washing machine in a manner similar to Embodiment 1. As the level of pure water 110 gradually becomes lower due to spin drying, surface tension is generated to attract lower electrodes 70 of adjacent capacitors to each other, however, this tension is mitigated by monomolecular film 124 (FIG. 10G). Then, after pure water 110 on the substrate is removed by spin drying, the substrate is baked at a temperature of 250° C. or higher to evaporate monomolecular film 124 (FIG. 10H).

Figure 10I:
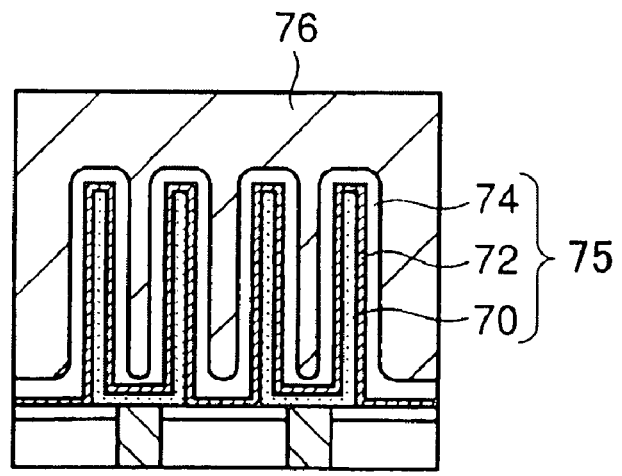

Then, capacitive insulating film 72 is formed by a CVD method, and a laminate metal film made of TiN/W film is next formed on capacitive insulating film 72. The patterns of upper electrodes 74 are formed with the laminate metal film by a lithographic process and an etching process, and insulating film 76 is formed to cover upper electrodes 74 (FIG. 10I).

In this way, after forming the lower electrodes of the capacitors, the amphiphilic material is spread in the washing process to prevent the lower electrodes from inclining during spin drying.

Alternatively, the washing apparatus may be previously provided with a heating mechanism, such that heat drying is included in the drying process. Also, while the substrate is baked after spin drying in this embodiment, the substrate may be baked in the middle of spin drying. Also, instead of baking after spin drying, the monomolecular film may be removed by thermal treatment in the formation of capacitive insulating film 72. Further, as illustrated in FIGS. 4A to 4D of Embodiment 1, the substrate need not be baked after spin drying. One of the drying methods (1)-(4), described in Embodiment 1, may be applied to Embodiment 2.

In the method of manufacturing a semiconductor device according to the present invention, the surface tension is reduced when a liquid that permeates the patterns is removed in the drying process to prevent the patterns from inclining. Accordingly, the aspect ratio need not be reduced to prevent the patterns from inclining, thus making it possible to ensure a sufficient height for the patterns.

Also, since a discharge mechanism alone needs to be added to a developing apparatus or to a washing apparatus to precisely drip an amphiphilic solution onto a substrate, existing apparatuses can be utilized with simple and inexpensive modifications.

Since the amphiphilic material and solvent for an amphiphilic solution are generally available as inexpensive items, the manufacturing cost is reduced. Also, since only an amount of amphiphilic solution sufficient to form a monomolecular film on the water surface may be dripped onto one substrate, the amount of used chemicals that can damage the environment is reduced.

A trace of amphiphilic material (monomolecular film), even if remaining on the substrate, will barely cause defects or contamination of the apparatus. Thus, residue which may influence the next process and cause defects is minimized.

Further, optimization can be realized because there is a high degree of freedom for adjusting the process such as manipulating the selection of the type of amphiphilic material, the amount of dripped amphiphilic material, the rotational speed of spin drying, and the like.

While Embodiment 2 has been described in connection with patterns, the bottom of which is circular, the patterns may have an oval or polygonal bottom. When a pattern has an oval bottom, the aspect ratio is calculated by using the length of the short axis of the oval and the height of the pattern. When a pattern has a rectangular bottom, the aspect ratio is calculated by using the length of a short side of the rectangle and the height of the pattern. When a pattern has a polygonal bottom of pentagon or more, the aspect ratio is calculated with the length of a line segment which passes the center of the polygon and connects to a side or an apex, and the height of the pattern.

Also, the washing liquid used as the sublayer water is not limited to pure water, but may be an acid or alkali solution, or the like.

In Embodiment 1 and Embodiment 2, when heat drying is included in the drying process, the developing apparatus or washing apparatus is provided with a heating mechanism, but a heating mechanism may be separately provided for drying.

Further, the present invention is not limited to the method of manufacturing a semiconductor device, but can be applied to overall micro-machining, such as washing in micro-machining in which the surface tension may cause patterns to incline.

While preferred embodiments of the present invention have been described using specific terms, such description is for illustrative purposes only, and it is to be understood that changes and variations may be made without departing from the spirit or scope of the following claims.

What is claimed is:

1. A method of manufacturing a semiconductor device, comprising:
   forming a pattern made of a processed film or a resist on a substrate;
   washing said pattern with a washing liquid which is a liquid consisting essentially of water, the washing liquid thereby remaining on the substrate having the pattern; then
   adjusting a pH value of the washing liquid as a function of an amount of an amphiphilic material; then
   spreading said amphiphilic material having a hydrophilic group and a hydrophobic group on a surface of the washing liquid remaining on said substrate to reduce surface tension of the washing liquid; and
   drying said substrate to substantially completely remove, from said substrate, the washing liquid remaining on said substrate after spreading said amphiphilic material.

2. The method of manufacturing a semiconductor device according to claim 1, wherein the amphiphilic material having a hydrophilic group and a hydrophobic group, the amphiphilic material stands vertically to a surface of the water with the hydrophilic group positioned closer to the water surface, thereby forming a monomolecular or bimolecular film.

3. The method of manufacturing a semiconductor device according to claim 1, wherein the amphiphilic material is a fatty acid, a lipid or a salt.

4. The method of manufacturing a semiconductor device according to claim 1, further comprising the step of removing the amphiphilic material after the drying step.

5. The method of manufacturing a semiconductor device according to claim 1, wherein said pattern made of the processed film is a pattern comprising an insulating film or a conductive film.

6. The method of manufacturing a semiconductor device according to claim 1, wherein said step of spreading said amphiphilic material includes controlling the amount of said amphiphilic material in relation to the area of a main surface of said substrate.

7. The method of manufacturing a semiconductor device according to claim 1, wherein said step of spreading said amphiphilic material includes controlling the amount of said amphiphilic material in relation to at least one condition, that being either the temperature of the washing liquid or an atmosphere.

8. The method of manufacturing a semiconductor device according to claim 1, wherein said step of spreading said amphiphilic material includes:
   supplying the washing liquid with a solution containing said amphiphilic material and controlling the amount of said amphiphilic material in the solution by controlling the concentration of said amphiphilic material.

9. The method of manufacturing a semiconductor device according to claim 8, wherein said amphiphilic material has a concentration in a range of 10E-5 - 10E-7 mol/ml.

10. The method of manufacturing a semiconductor device according to claim 1, wherein said drying step includes spin drying.

11. The method of manufacturing a semiconductor device according to claim 10, wherein said spin drying includes spinning said substrate at a predetermined rotational speed, and then spinning said substrate at a rotational speed higher than the predetermined rotational speed.

12. The method of manufacturing a semiconductor device according to claim 1, wherein said drying step includes additionally supplying said amphiphilic material to the washing liquid remaining on said substrate while spin drying is being performed.

13. A method of manufacturing a semiconductor device, comprising:
   forming a pattern made of a processed film or a resist on a substrate;
   washing said pattern with a washing liquid which is a liquid consisting essentially of water, the washing liquid thereby remaining on the substrate having the pattern;
   spreading an amphiphilic material having a hydrophilic group and a hydrophobic group on a surface of the washing liquid remaining on said substrate to reduce surface tension of the washing liquid; and drying said substrate to substantially completely remove, from said substrate, the washing liquid remaining on said substrate after spreading said amphiphilic material, wherein said drying step includes at least a step of heating said substrate at a temperature higher than the boiling points of said washing liquid and said amphiphilic material.

14. A method of manufacturing a semiconductor device, comprising:

forming a pattern made of a processed film or a resist on a substrate;

washing said pattern with a washing liquid which is a liquid consisting essentially of water, the washing liquid thereby remaining on the substrate having the pattern;

spreading an amphiphilic material having a hydrophilic group and a hydrophobic group on a surface of the washing liquid remaining on said substrate to reduce surface tension of the washing liquid; and drying said substrate to substantially completely remove, from said substrate, the washing liquid remaining on said substrate after spreading said amphiphilic material, wherein said drying step includes a step of heating said substrate, and said step of heating includes heating said substrate in a temperature range of 100° C. to 240° C. when said pattern comprises the resist.

15. A method of manufacturing a semiconductor device, comprising:

forming a pattern made of a processed film or a resist on a substrate;

washing said pattern with a washing liquid which is a liquid consisting essentially of water, the washing liquid thereby remaining on the substrate having the pattern;

spreading an amphiphilic material having a hydrophilic group and a hydrophobic group on a surface of the washing liquid remaining on said substrate to reduce surface tension of the washing liquid; and drying said substrate to substantially completely remove, from said substrate, the washing liquid remaining on said substrate after spreading said amphiphilic material, wherein said drying step includes a step of heating said substrate, and said step of heating includes heating said substrate in a temperature range of 100° C. to 600° C. when said pattern comprises the processed film.

16. The method of manufacturing a semiconductor device according to claim 3, wherein the fatty acid is a long chain fatty acid, and the salt is a long chain salt.

17. The method of manufacturing a semiconductor device according to claim 3, wherein the fatty acid is stearic acid or myristic acid, and the lipid is a liposome having two hydrophobic chains, and the liposome forms a bimolecular film from strong cohesion of hydrocarbons.

18. A method of manufacturing a semiconductor device comprising:

forming a pattern made of a processed film or a resist on a substrate;

washing said pattern with pure water;

spreading an amphiphilic material having a hydrophilic group and a hydrophobic group on a surface of the pure water remaining on said substrate after washing said pattern, the amphiphilic material has a concentration in a range of 10E-5 to 10E-7 mol/ml, the amphiphilic material forming a monomolecular or bimolecular film, the amphiphilic material being a fatty acid, a lipid or a salt;

drying said substrate to remove the washing liquid on said substrate after spreading said amphiphilic material; and removing the amphiphilic material.

19. The method of manufacturing a semiconductor device according to claim 18, wherein the amphiphilic material forms the monomolecular film.

* * * * *